United States Patent
Yang et al.

(10) Patent No.: US 9,825,138 B2
(45) Date of Patent: Nov. 21, 2017

(54) FIELD EFFECT TRANSISTOR AND METHOD OF MAKING

(71) Applicant: Texas Instruments Incorporated, Dallas, TX (US)

(72) Inventors: Hong Yang, Richardson, TX (US); Zachary K. Lee, Fremont, CA (US); Yufei Xiong, Chengdu (CN); Yunlong Liu, Chengdu (CN); Wei Tang, Chengdu (CN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/188,188

(22) Filed: Jun. 21, 2016

(65) Prior Publication Data
US 2016/0315155 A1      Oct. 27, 2016

Related U.S. Application Data

(62) Division of application No. 14/692,337, filed on Apr. 21, 2015, now Pat. No. 9,406,774.

(51) Int. Cl.
| | |
|---|---|
| *H01L 29/78* | (2006.01) |
| *H01L 29/40* | (2006.01) |
| *H01L 29/66* | (2006.01) |
| *H01L 29/10* | (2006.01) |

(52) U.S. Cl.
CPC ........ *H01L 29/407* (2013.01); *H01L 29/1083* (2013.01); *H01L 29/665* (2013.01); *H01L 29/66666* (2013.01); *H01L 29/7802* (2013.01); *H01L 29/7827* (2013.01); *H01L 29/7834* (2013.01)

(58) Field of Classification Search
CPC ............... H01L 29/0634; H01L 29/407; H01L 29/41766; H01L 29/7827
See application file for complete search history.

(56) References Cited

U.S. PATENT DOCUMENTS

| | | | |
|---|---|---|---|
| 8,803,236 B1 * | 8/2014 | Lee ..................... | H01L 29/4175 257/340 |
| 2007/0034944 A1 | 2/2007 | Xu et al. | |

* cited by examiner

*Primary Examiner* — Tran Tran
(74) *Attorney, Agent, or Firm* — Jacqueline J. Garner; Charles A. Brill; Frank D. Cimino

(57) ABSTRACT

A method of fabricating a FET includes forming a gate on the surface of a substrate. A trench contact extends between a first region located proximate the surface of the substrate and a second region located below the first region is formed in the surface. The surface of the substrate is coated with a conductive material, wherein the conductive material at least partially covers the gate and lines the trench contact to electrically connect the first region and the second region. A void remains in the trench contact. A dielectric material is applied to the conductive material, wherein the dielectric material at least partially fills the void in the trench contact. At least a portion of the conductive material is etched from the gate.

19 Claims, 3 Drawing Sheets

FIELD EFFECT TRANSISTOR AND METHOD OF MAKING

CROSS REFERENCE TO RELATED APPLICATIONS

This application is a divisional of U.S. Nonprovisional patent application Ser. No. 14/692,337, filed Apr. 21, 2015, the contents of which is herein incorporated by reference in its entirety.

BACKGROUND

Source down field effect transistors (FETs) are fabricated on a semiconductor substrate wherein the source is located below the substrate. A trench contact or the like lined with a conductor, such as a metal field plate, electrically connects the surface of the substrate to the source located below the substrate. The conductor, if used as a metal field plate, also serves to shield the gate from the drain metal. In some embodiments, the conductor is a layer of titanium nitride, TiN, that coats the top or a substantial portion of the top of the semiconductor and the components fabricated onto the semiconductor.

The conductor covers the gate stacks of the FETs and can be located very close to conductive portions of the gate stacks, which are fabricated on the surface of the semiconductor. In some situations, the conductor is close enough to the conductive portions of the gate stacks to cause shorts between the gates and the conductor, which is coupled to the sources of the FETs. The results are shorts between gates and sources in the FETs, which render the FETs inoperative. As the FETs become smaller, the conductors get close to the gates. The closer proximity of the conductors and gates increases the chances that the conductors will short to the gates.

SUMMARY

A method of fabricating a FET includes forming a gate on the surface of a substrate. A trench contact extends between a first region located proximate the surface of the substrate and a second region located below the first region. The surface of the substrate is coated with a conductive material, wherein the conductive material at least partially covers the gate and lines the trench contact to electrically connect the first region and the second region. A void remains in the trench contact. A dielectric material is applied to the conductive material, wherein the dielectric material at least partially fills the void in the trench contact. At least a portion of the conductive material is etched from the gate.

DETAILED DESCRIPTION

The terms "substrate" or "semiconductor substrate" used in the following description may include any semiconductor-based structure that has a semiconductor surface. The semiconductor-based structure includes silicon, doped and undoped semiconductors, epitaxial layers of silicon supported by a base semiconductor foundation, and other semiconductor structures. The semiconductor may be silicon-based or silicon-germanium, germanium, gallium arsenide, silicon carbide, or gallium nitride or other semiconductor material.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

The Figures and the description illustrate relative doping concentrations by indicating "−" or "+" next to the doping type "n" or "p". The term, "n−" means a doping concentration that is lower than the doping concentration of an "n" doping region while an "n+" doping region has a higher doping concentration than an "n" doping region. Doping regions of the same relative doping concentration do not necessarily have the same absolute doping concentration. In the Figures and the description, for the sake of a better comprehension, often the doped portions are designated as being "p" or "n" doped. The doping type can be arbitrary as long as the described functionality is achieved and, in all examples, the doping types can be reversed.

Figure 1:
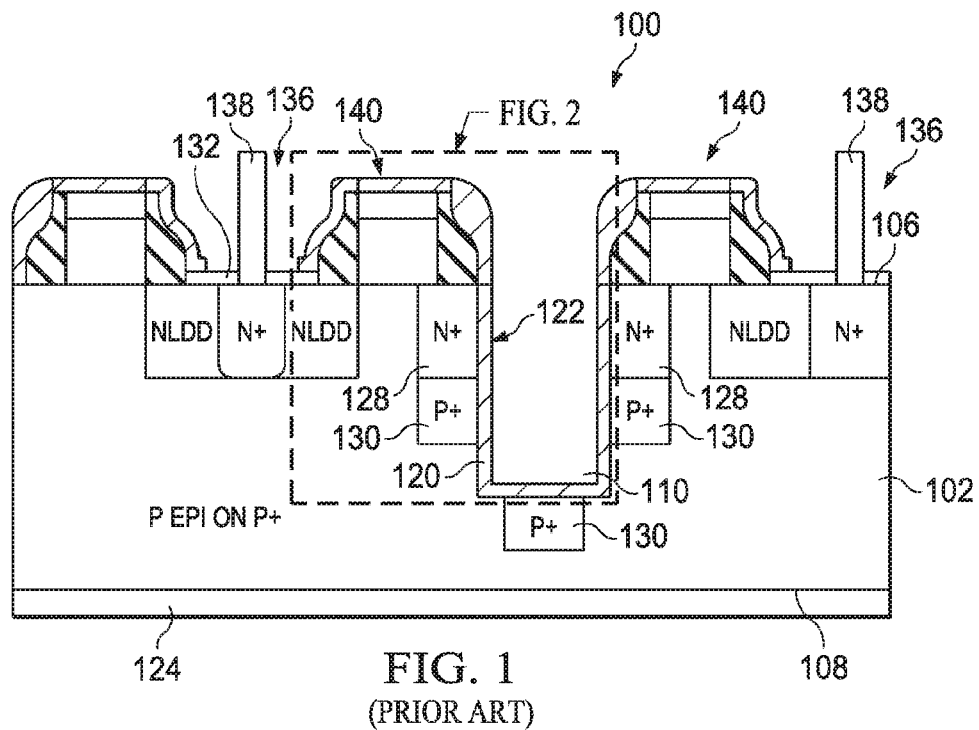
FIG. 1 is side cutaway view of an embodiment of a prior art source down field effect transistor (FET).

FIG. 1 is side cutaway view of an example prior art N-channel source-down field effect transistor (FET) 100. The FET 100 is fabricated on a semiconductor substrate 102, which in the example of FIG. 1 is a P epitaxial (EPI) wafer on a P+ substrate. The substrate 102 has a first surface 106 and an opposite second surface 108. The substrate 102 includes a deep trench contact 110 extending from the first surface 106 toward the second surface 108. In some examples, the trench contact 110 extends to a depth of 0.2 to 10 um from the first surface 106 and has an aspect ratio (depth to width ratio) of between one and five. The trench contact 110 is lined with a conductor 120 to form a deep contact 122 that serves to short or connect a source 124 located on the second surface 108 to the first surface 106 of the substrate 102. In some examples, the conductor 120 is primarily titanium nitride (TiN) and is referred to as a metal field plate or simply a "plate". The deep contact 122 is located proximate an N+ region 128 that serves as a source diffusion region. The deep contact 122 is also located proximate a single P+ region 130 or a plurality of P+ regions 130. The plate 120 electrically connects the N+ region 128 with the P+ regions 130.

During fabrication of the FET 100, all the components on the first surface 106 of the substrate 102 are coated with a dielectric layer 132, which is typically an oxide material. Following the coating with the dielectric layer 132, the trench contact 110 is fabricated by etching and/or other techniques to form the trench contact 110 in the substrate 102. The plate 120 is then deposited onto the first surface 106, including the inside surface the trench contact 110 to form the above-described deep contact 122. In the embodiments described herein, the plate 120 covers all the components on the first surface 106 of the substrate 102. In the prior art examples, such as described with reference to FIG. 1, a photo resist mask must be placed or deposited onto the plate 120 to cover all areas and components on the first surface 106 except drain regions 136. The drain regions 136 are areas on the first surface 106 where the drain of the FET 100 is to be fabricated, so the plate 120 must be removed from the drain regions 136. The plate 120 is then etched, or patterned etched, with an etching compound, such as an acid or plasma that does not react with the mask. The result is a void in the plate 120 proximate the drain regions 136. An oxide (not shown), such as a plasma enhanced oxide, is deposited to form a pre-metal dielectric layer (PMD) on the first surface 106. Drain contacts 138 are then fabricated or deposited onto the first surface 106 in the drain regions 136. Based on the foregoing, the prior art FET fabrication requires a masking process and an etching process to remove the plate 120 proximate the drain regions 136.

Figure 2:
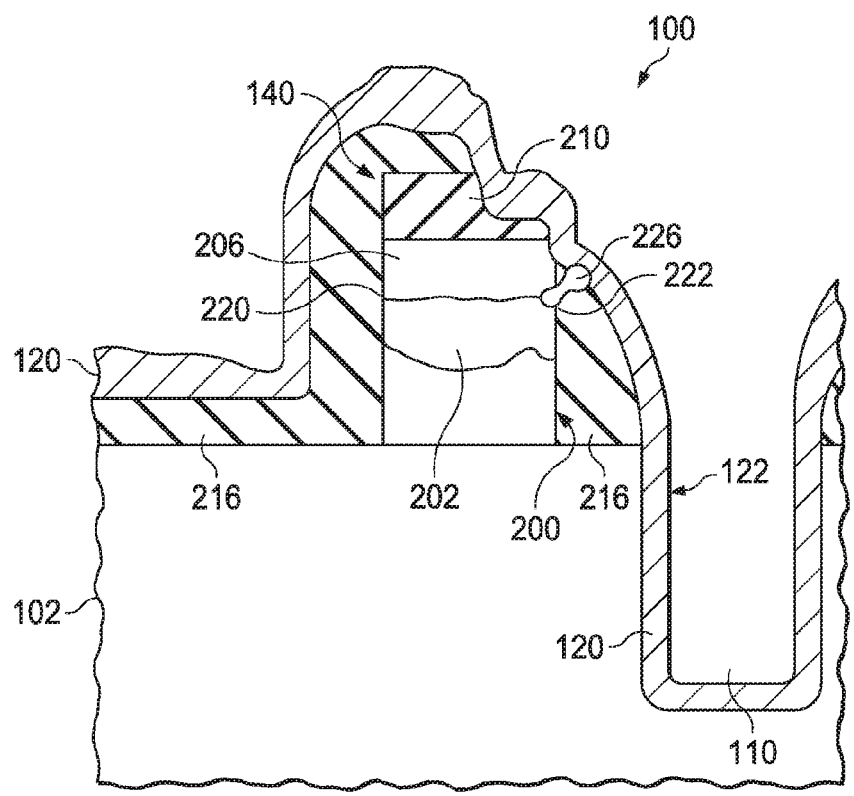
FIG. 2 is an expanded view of a gate in the FET of FIG. 1 and shows the gate shorted to a conductor that covers the gate.

As shown in FIG. 1, the FET 100 also includes a gate 140 that is fabricated on the first surface 106 of the substrate 102 in a conventional manner. As described in greater detail below, the plate 120 covers the gate 140 to shield the gate 140 from the drain. FIG. 2 is an expanded view of a gate 140 and shows the gate 140 shorted to the plate 120. The gate 140 includes a post 200, which in some examples is a polysilicon post, that has a conductive region 202 formed thereon. In some embodiments, the conductive region 202 is silicide metal. Both the post 200 and the conductive region 202 are deposited onto a gate stack, which is infused into the first surface 106. An oxide layer 206 is located above the post 200. A hard mask 210, such as silicon nitride, is located above the oxide layer 206. A spacer 216 surrounds the gate 140 and is located between the gate 140 and the plate 120. In some examples, the spacer 216 is a dielectric film.

The side cutaway view of the gate 140 has two corners 220 and 222 wherein the corner 220 is located further from the plate 120 than the corner 222. More specifically, the geometry of the gate 140 and/or other manufacturing processes causes the spacer 216 in the proximity of the corner 222 to be thin. The thin spacer 216 enabled a short 226 to form between the corner 222 and the plate 120 through the spacer 216. In many FETs, this short 226 causes a failure of the FET. As the FETs are made smaller, portions of the gates, including the corners 220 and 222 tend to be located closer to the plate 120 because the spacer 216 is required to be thinner and the thinner spacer 216 makes the FET 100 more susceptible to shorts. The FETs and methods of making FETs described herein overcome the shorting problem and eliminate the need to apply a photomask to the plate 120.

Figure 3:
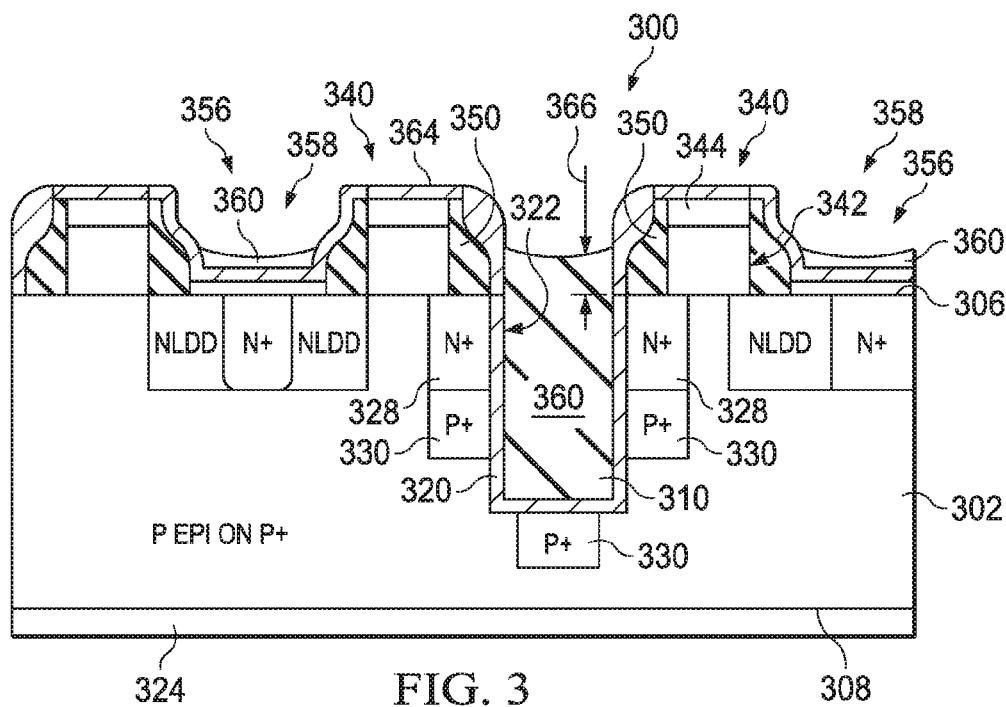
FIG. 3 is a side cutaway view of an example FET in the process of being fabricated.

FIG. 3 is a side cutaway view of an N-channel source-down FET 300 in the process of being fabricated. An N-channel FET 300 is described herein as an example; however, other examples include P-channel FETs having opposite polarities and types may be fabricated with virtually the same steps. The FET 300 is fabricated on a semiconductor substrate 302, which in the example of FIG. 3 is a P epitaxial (EPI) wafer on a P+ substrate. The substrate 302 has a first surface 306 and an opposite second surface 308. The substrate 302 includes a trench contact 310 extending from the first surface 306 toward the second surface 308. In some examples, the trench contact 310 extends to a depth of 0.2 to 10 um and has an aspect ratio (depth to width ratio) of between one and five. The trench contact 310 is lined with a metal plate 320 (sometimes referred to as a "conductive material" or a "field plate") to form a deep contact 322 that serves to short or connect a source 324 located on the second surface 308 to the first surface 306 of the substrate 302. The deep contact 322 is located proximate and is electrically connected to an N+ region 328 that serves as a source diffusion region of the gate 340. The deep contact 322 is also located proximate and is electrically connected to a single P+ region 330 or a plurality of P+ regions 330. The plate 320 electrically connects the N+ region 328 with the P+ regions 330.

The FET 300 includes a gate 340 that is fabricated on the first surface 306 of the substrate 302 and encircles the trench contact 310. The gate 340 includes a post 342 that has a hard mask 344, such as silicon nitride, located thereon. The gate 340 may also include a conductive region and an oxide layer as known in the art. In the example of FIG. 3 a spacer 350 is located adjacent the post 342 and surrounds the post 342 and the sides of the hard mask 344. In some embodiments, the spacer 350 is a dielectric film that is deposited in a conventional manner. The plate 320 has recessed portions 356 that are located proximate gate portions 358. Drain contacts will be fabricated onto the first surface 306 of the substrate 302 proximate the gate portions 358 later in the fabrication process.

At this stage of fabrication all components of the FET 300 on the first surface 306 of the substrate 302, including the trench contact 310, are coated with the plate 320. The trench contact 310 is then filled with a dielectric material 360, such as spin-on glass (SOG), which in some examples is silicon dioxide, $SiO_2$, or a polymeric dielectric. The dielectric material 360 prevents the deep contact 322 from being etched during a subsequent etching process and, as such, may function as a resist material. Other materials that fill the trench contact 310 and prevent the deep contact 322 from being etched may be used as substitutes for the SOG. In the example of FIG. 3, the dielectric material 360 is deposited on a top surface 364 of the plate 320 by a spin-on process, which causes the dielectric material 360 to fill the trench contact 310. The trench contact 310 is filled to a depth 366 above the first surface 306 of the substrate 302. The depth 366 of the dielectric material 360 is a design choice and has been chosen so that subsequent etching processes that may etch the dielectric material 360 do not etch far enough into the trench contact 310 so as to etch or damage the deep contact 322. As shown in FIG. 3, some residual material 360 also fills the recessed portions 356 and is generally thin enough so as to be removed during a subsequent etching process.

Figure 4:
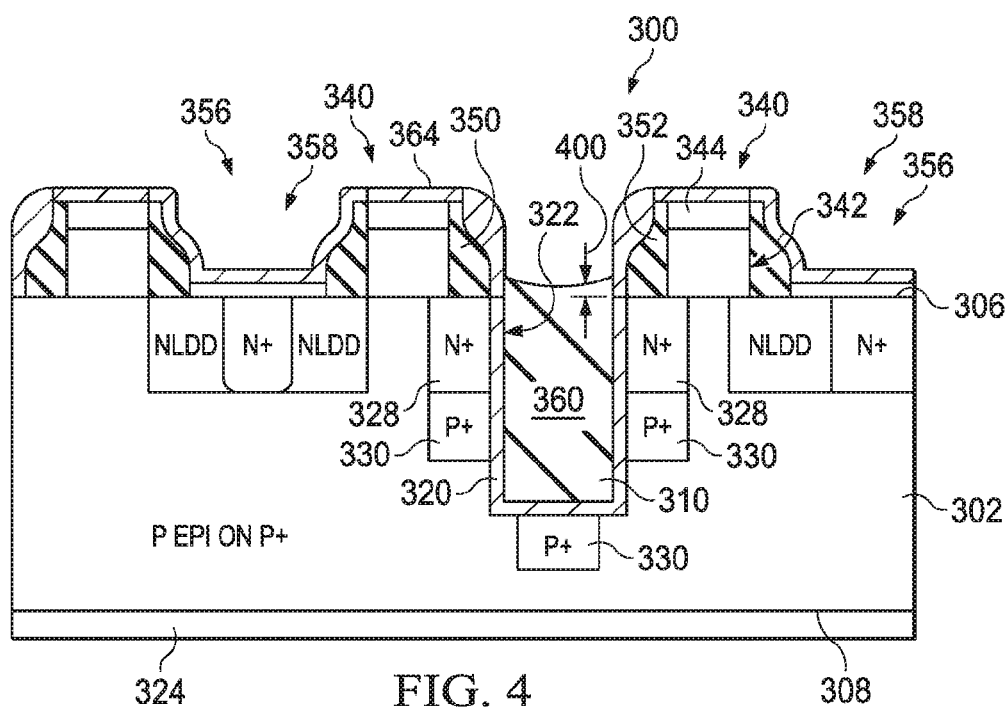
FIG. 4 is a side cutaway view of the example FET of FIG. 3 after etching.

An etching compound is applied to the FET 300 to etch the plate 320. FIG. 4 is a side cutaway view of the FET 300 after application of the etching compound. The etching compound has removed the residual dielectric material 360 from the recessed portions 356 proximate the drain regions 358. The etching also removed some of the dielectric material 360 from the trench contact 310, so that the top of the dielectric material 360 in the trench contact 310 now extends a distance 400 above the first surface 306 of the substrate 302. Because the material 360 remains above the first surface 306, the deep contact 322 continues to provide the electrical connection between the N+ region 328 and the P+ region 330. In other examples, the height of the dielectric material 360 in the trench contact 310 is different than shown in FIG. 4, but it still enables the connection between the N+ region 328 and the P+ region 330 to remain. In some examples, a blanket etch is applied to the FET 300 and removes the plate 320 without the application of a photo resist mask that is required in the fabrication of conventional FETs. Accordingly, the masking step utilized in conventional FET fabrication is not required, which reduces the costs and fabrication time of the FET 300.

Figure 5:
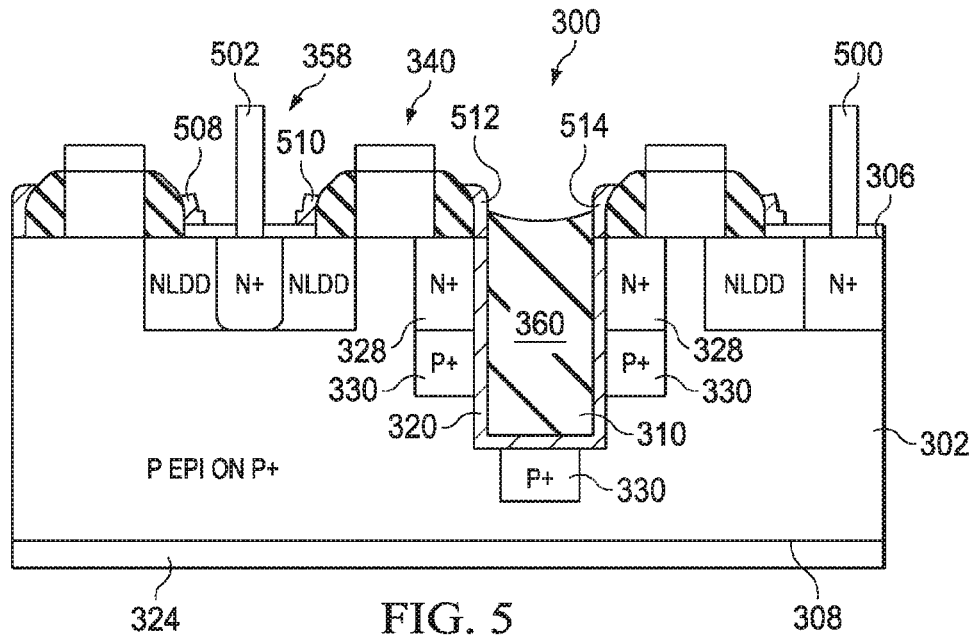
FIG. 5 is a side cutaway view of the example FET of FIG. 4 after a plate that was etched is rinsed.

FIG. 5 is a side cutaway view of an example of the FET 300 of FIG. 4 after the plate 320 has been etched. The FET 300 of FIG. 5 has drain contacts 500 and 502 fabricated onto the first surface 306 of the substrate 302. As shown in the example of FIG. 5, residual portions 508 and 510 of the plate 320, FIG. 4, remain proximate the drain region 358, however, these residual portions 508 and 510 are electrically isolated from contacts on the gate 340 and do not affect the performance of the FET 300. In some examples, no portions of the plate 320 remain after the etching process. The portions 512 and 514 of the plate 320 are located proximate the gate 340, however, the plate 320 has been etched a distance from the gate 340 so that the plate 320 will not short to the gate 340. Accordingly, the thin dielectric spacer between the gate and the plate in conventional FETs is not an issue with the FET 300, so the gates 340 can be densely populated on the first surface 306 of the substrate 302. In addition, the whole plate 320, except the portion constituting the deep contact 322 is etched from the first surface 306 of the substrate 302, so the step of masking the gate portions of the conventional FETs is not required. It is noted that in FETs having low drain/source voltages (VDS), the shielding function of the plate 320 is not necessary, so there are no adverse effects associated with the removal of the plate 320 from the gate 340.

Figure 6:
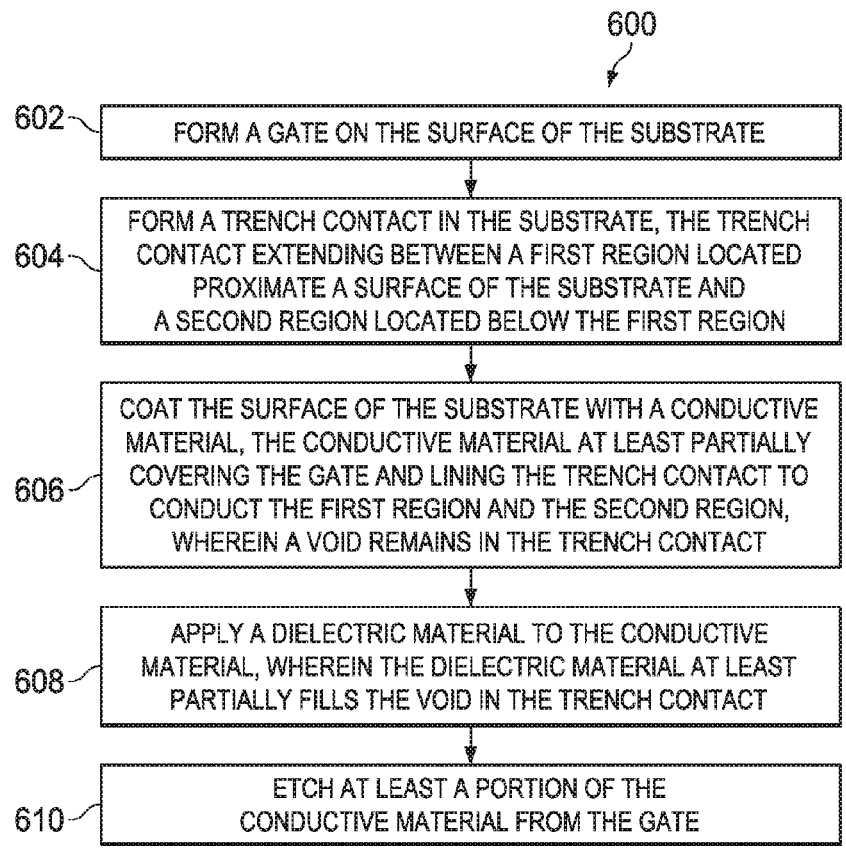
FIG. 6 is a flow chart of a process for fabricating the example FET of FIG. 5.

FIG. 6 is flowchart 600 of an example method for fabricating the FET 300. Step 602 includes forming a gate 340 on the surface 306 of the substrate 302. At step 604, the method includes forming a trench contact 310 in the substrate 302, the trench contact 310 extending between a first region 328 located proximate a surface 306 of the substrate 302 and a second region 330 located below the first region 328. Step 606 includes coating the surface 306 of the substrate 302 with a conductive material 320, the conductive material 320 at least partially covering the gate 340 and lining the trench contact 310 to conduct the first region 328 and the second region 330, wherein a void remains in the trench contact 310. Step 608 includes applying a dielectric material 360 to the conductive material 320, wherein the dielectric material 360 at least partially fills the void in the trench contact 310. Step 610 includes etching at least a portion of the conductive material 320 from the gate 340.

While some examples of field effect transistors have been described in detail herein, it is to be understood that the inventive concepts may be otherwise variously embodied and employed and that the appended claims are intended to be construed to include such variations except insofar as limited by the prior art.

What is claimed is:

1. A field effect transistor (FET) comprising:
   a trench contact;
   a conductive material lining at least a portion of the trench contact;
   a first region and a second region located proximate the trench contact and electrically coupled by way of the conductive material lining at least a portion of the trench contact;
   a gate, wherein the conductive material has been etched from over at least a portion of the gate and does not extend over the gate; and
   a dielectric material at least partially filling the trench contact, the dielectric material being resilient to an etching material applied to the conductive material.

2. The FET of claim 1, wherein the FET has a surface and wherein the conductive material has been etched from all portions of the surface.

3. The FET of claim 1, wherein the dielectric material is a spin on glass material.

4. The FET of claim 1, wherein the gate comprises a conductive region and wherein the conductive material has been etched from locations proximate the conductive region of the gate.

5. The FET of claim 1, wherein the FET comprises a drain region, wherein the conductive material has been etched from the drain region.

6. The FET of claim 1, wherein the conductive material is a field plate.

7. The FET of claim 1, wherein the conductive material substantially comprises titanium nitride.

8. A field effect transistor (FET) comprising:
   a trench contact extending into a substrate, the trench contact comprising:
      a conductive material lining at least a portion of a trench; and
      a dielectric material at least partially filling the trench;
   a first region at a surface of the substrate and a second region below the surface of the substrate, wherein the first region and the second region are located proximate the trench contact and electrically coupled by way of the conductive material lining at least a portion of the trench contact; and
   a gate above the surface of the substrate, wherein the conductive material extends above the surface of the substrate and does not extend over the gate.

9. The FET of claim 8, further comprising a drain region, wherein unconnected portions of the conductive material are located over the drain region.

10. The FET of claim 8, wherein the dielectric material is a spin on glass material.

11. The FET of claim 8, wherein the gate comprises a conductive region and wherein no portion of the conductive material is located proximate the conductive region of the gate.

12. The FET of claim 8, wherein the FET comprises a drain region and wherein no portion of the conductive material is located over the drain region.

13. The FET of claim 8, wherein the conductive material substantially comprises titanium nitride.

14. A field effect transistor (FET) comprising:
   a substrate having a first surface and a second surface;
   a trench contact extending into the substrate from the first surface, the trench contact including a conductive material lining at least a portion of a trench and a dielectric material at least partially filling the trench;
   a source region of a first conductivity type at the first surface of the substrate and a sub-surface region of a second conductivity type, wherein the source region and the sub-surface region are located proximate the trench contact and electrically coupled by way of the conductive material lining at least a portion of the trench contact;
   a drain region of the first conductivity type at the first surface of the substrate;
   a gate above the first surface of the substrate between the source region and the drain region, wherein the conductive material extends above the first surface of the substrate and does not extend over the gate; and
   a source on the second surface of the substrate, wherein the trench contact electrically connects the source on the second surface and the source region at the first surface.

15. The FET of claim 14, wherein unconnected portions of the conductive material are located over the drain region.

16. The FET of claim 14, wherein the dielectric material is a spin on glass material.

17. The FET of claim 14, wherein the gate comprises a conductive region and wherein no portion of the conductive material is located proximate the conductive region of the gate.

18. The FET of claim 14, wherein no portion of the conductive material is located over the drain region.

19. The FET of claim 14, wherein the conductive material comprises titanium nitride.

* * * * *